United States Patent
Graf et al.

(10) Patent No.: US 7,314,803 B2
(45) Date of Patent: Jan. 1, 2008

(54) METHOD FOR PRODUCING A SEMICONDUCTOR STRUCTURE

(75) Inventors: Werner Graf, Dresden (DE); Lars Heineck, Dresden (DE); Jana Horst, Dresden (DE)

(73) Assignee: Infineon Technologies AG, Munich (DE)

( * ) Notice: Subject to any disclaimer, the term of this patent is extended or adjusted under 35 U.S.C. 154(b) by 216 days.

(21) Appl. No.: 11/282,432

(22) Filed: Nov. 18, 2005

(65) Prior Publication Data

US 2006/0141756 A1 Jun. 29, 2006

(30) Foreign Application Priority Data

Dec. 15, 2004 (DE) .................. 10 2004 060 346

(51) Int. Cl.
*H01L 21/336* (2006.01)
*H01L 21/461* (2006.01)
*H01L 21/302* (2006.01)

(52) U.S. Cl. .................. 438/296; 438/199; 438/197; 438/689; 438/510; 438/514; 438/527; 438/531; 438/299; 438/301; 438/306; 257/E21.645; 257/E21.691; 257/E21.66; 257/E21.69; 257/E21.678

(58) Field of Classification Search .............. 438/296, 438/689, 197, 199, 510, 514, 527, 531, 299, 438/301, 306; 257/E21.645, E21.691, E21.66, 257/E21.69, E21.678
See application file for complete search history.

(56) References Cited

U.S. PATENT DOCUMENTS 5,972,764 A * 10/1999 Huang et al. ............... 438/305
6,284,592 B1 9/2001 Lee
6,440,791 B1 8/2002 Gau
6,503,789 B1 * 1/2003 Kim et al. .................. 438/232
6,995,413 B2 * 2/2006 Inoue et al. ................ 257/296
7,049,193 B2 * 5/2006 Maldei et al. .............. 438/241
2003/0064562 A1 4/2003 Kim et al.
2004/0173833 A1 9/2004 Tsugane et al.

FOREIGN PATENT DOCUMENTS

DE 10314595 10/2004
TW 94138654 12/2001

OTHER PUBLICATIONS

Taiwanese Pre-Examination Report dated Feb. 1, 2007.

* cited by examiner

*Primary Examiner*—Michael Lebentritt
*Assistant Examiner*—Mohsen Ahmadi
(74) *Attorney, Agent, or Firm*—Eschweiler & Associates, LLC

(57) ABSTRACT

In a method for producing a semiconductor structure a semiconductor a substrate with a top surface is provided. A gate dielectric layer is provided on the top surface and on the gate dielectric layer is provided a memory cell array region with a first plurality of gate stacks and a peripheral element region with a second plurality of gate stacks. A dielectric layer is provided over the memory cell array region and the peripheral element region. A first source/drain implantation over the memory cell array region and the peripheral element region is carried out, a blocking mask over the memory cell array region is formed, the dielectric layer is removed using the blocking mask, and a second source/drain implantation over the memory cell array region and the peripheral element region is carried out, wherein the memory cell array region is protected by a mask.

8 Claims, 8 Drawing Sheets

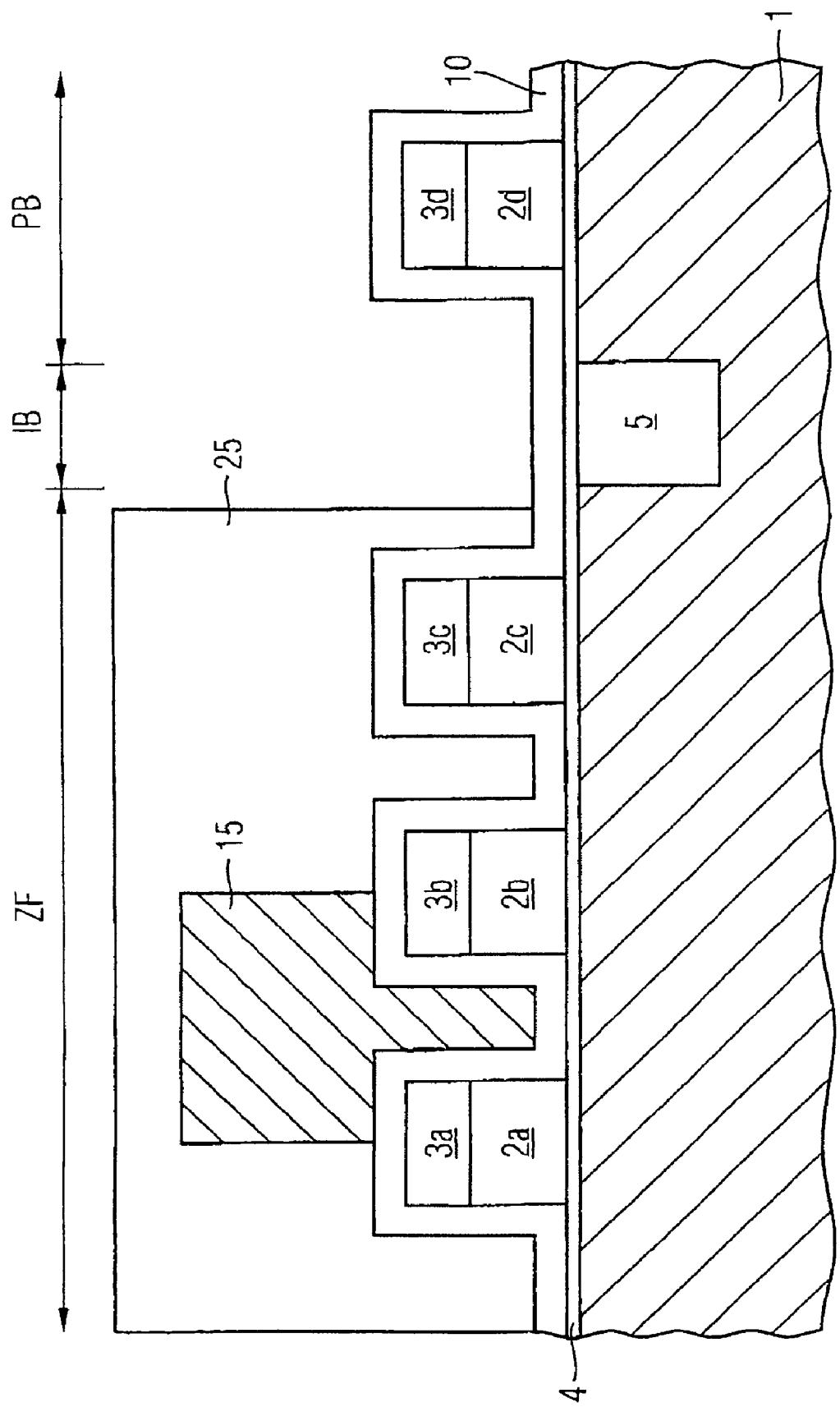

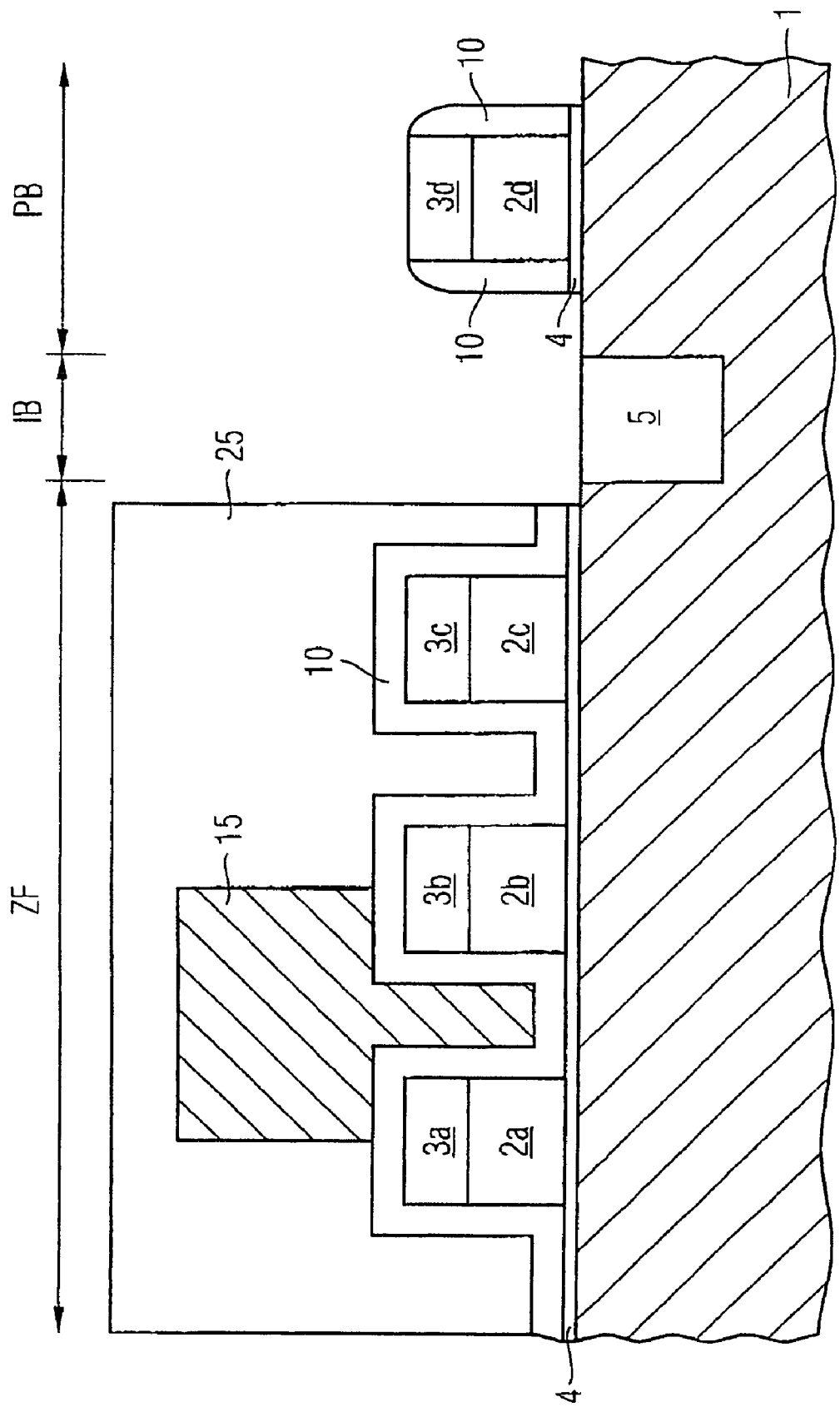

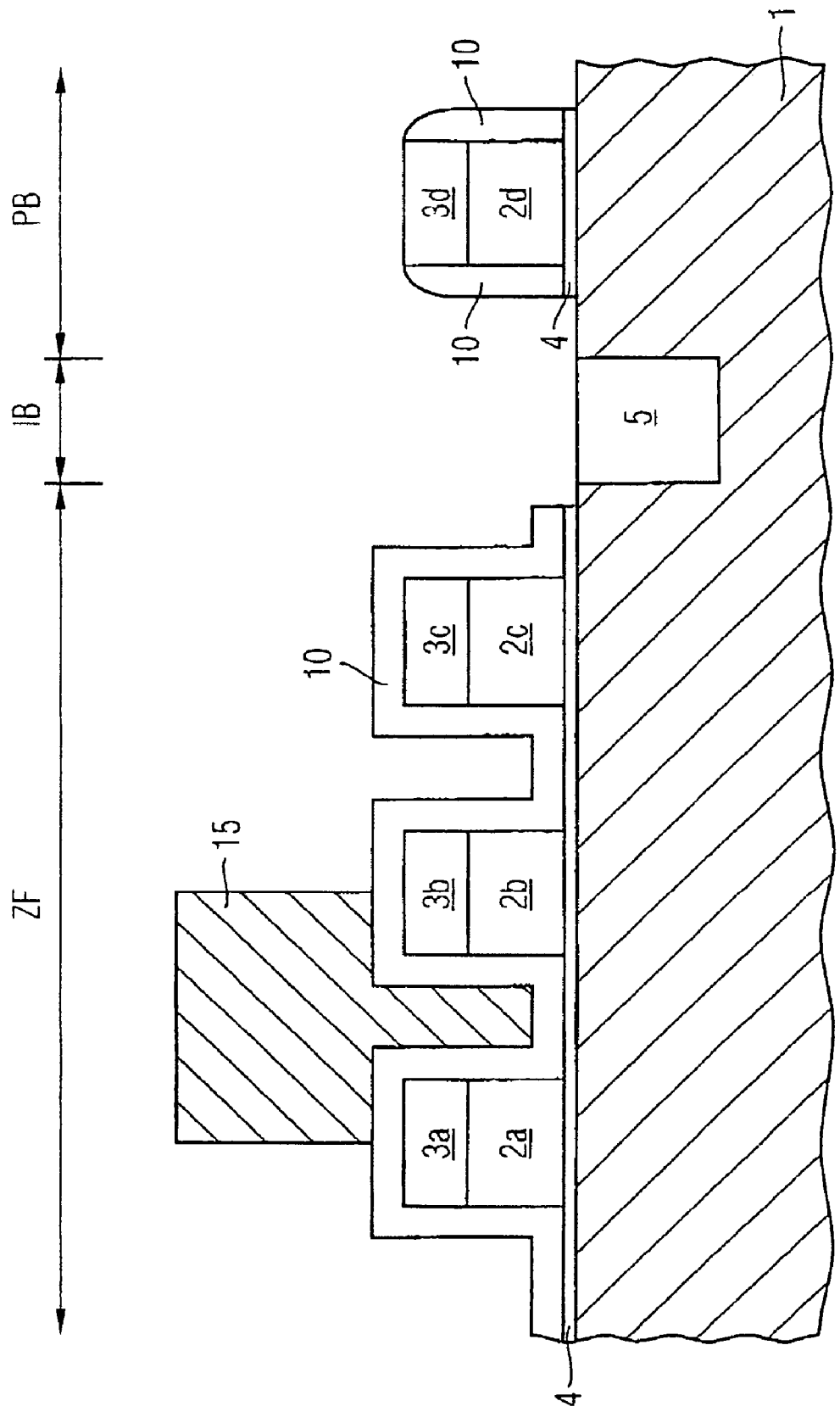

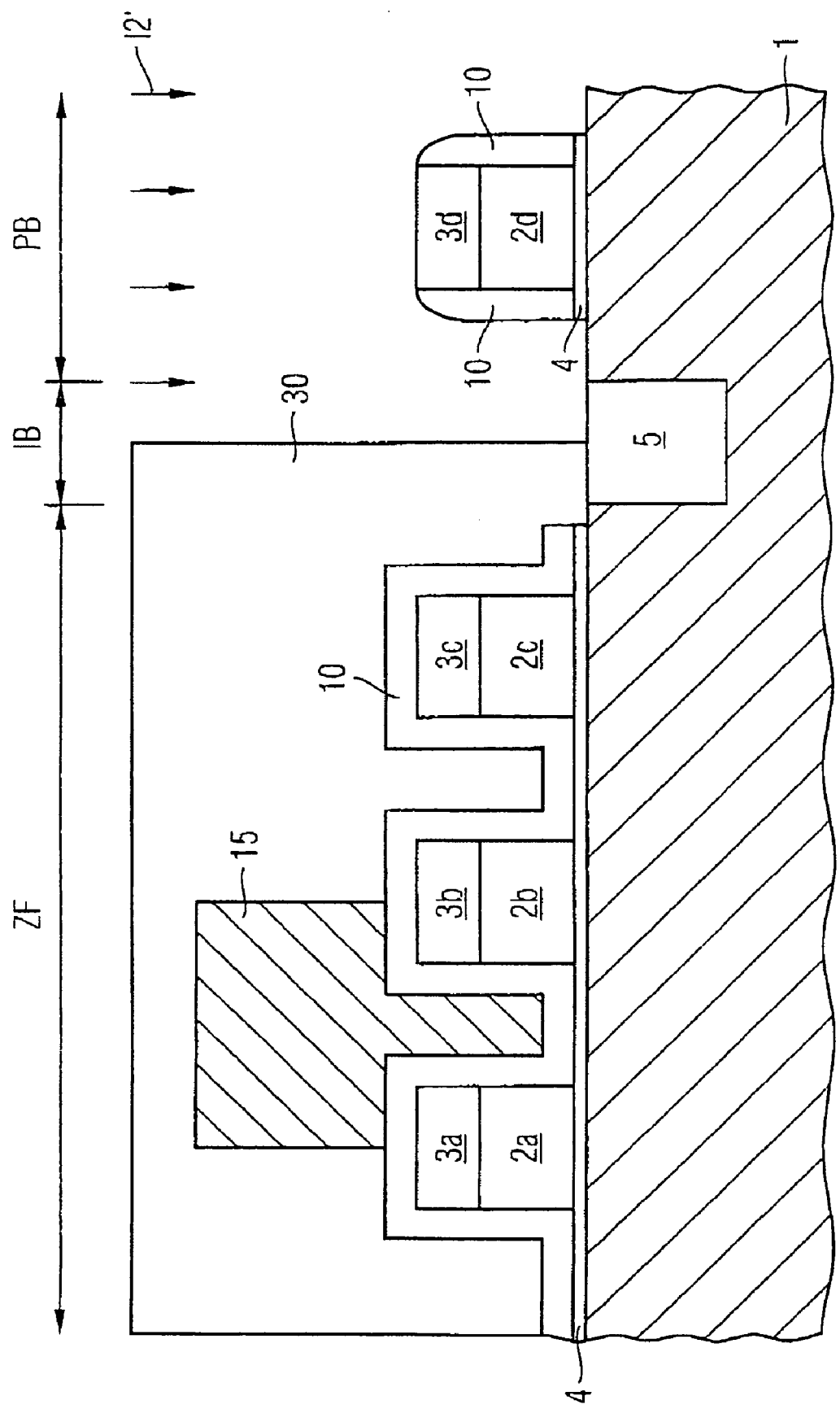

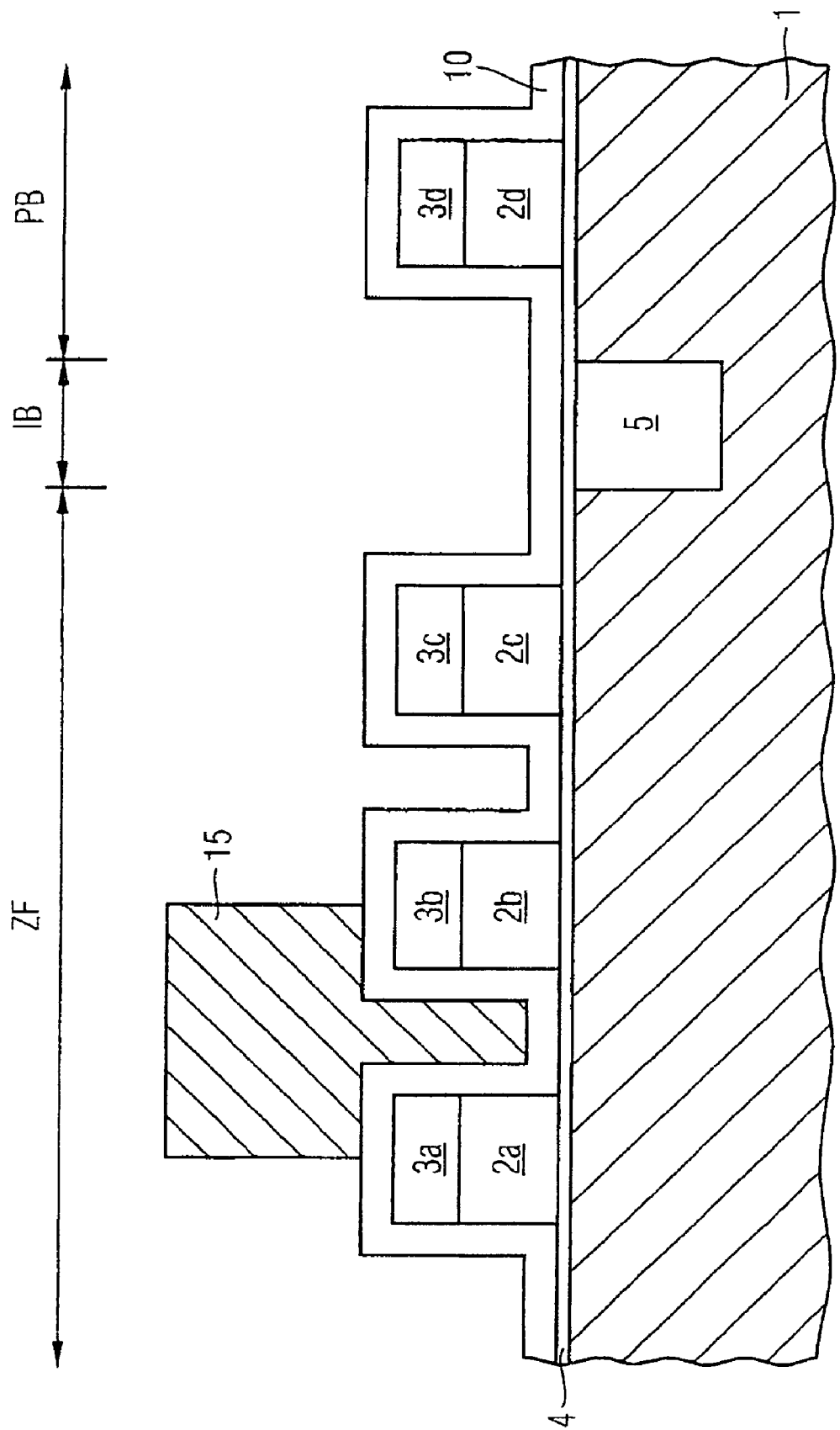

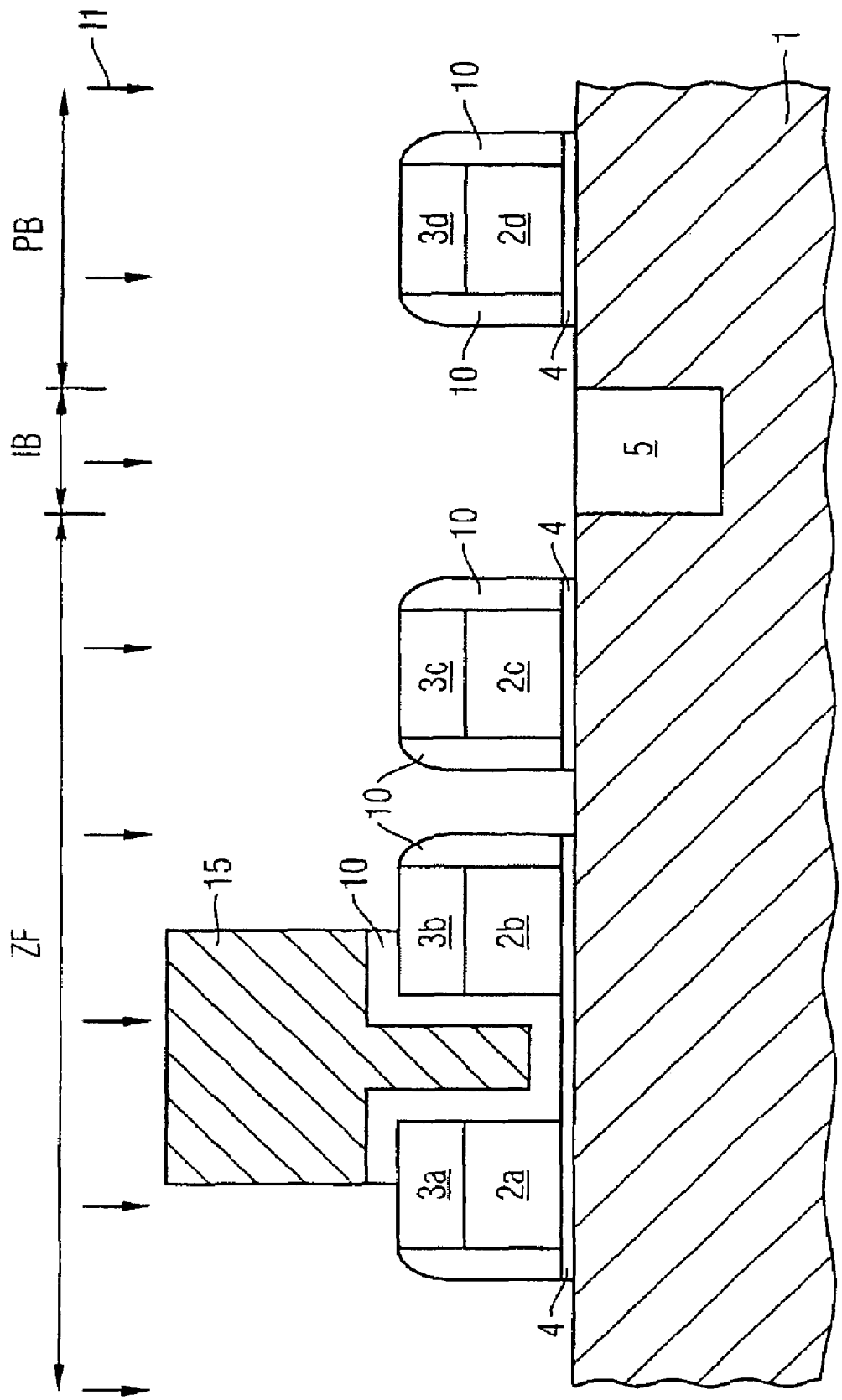

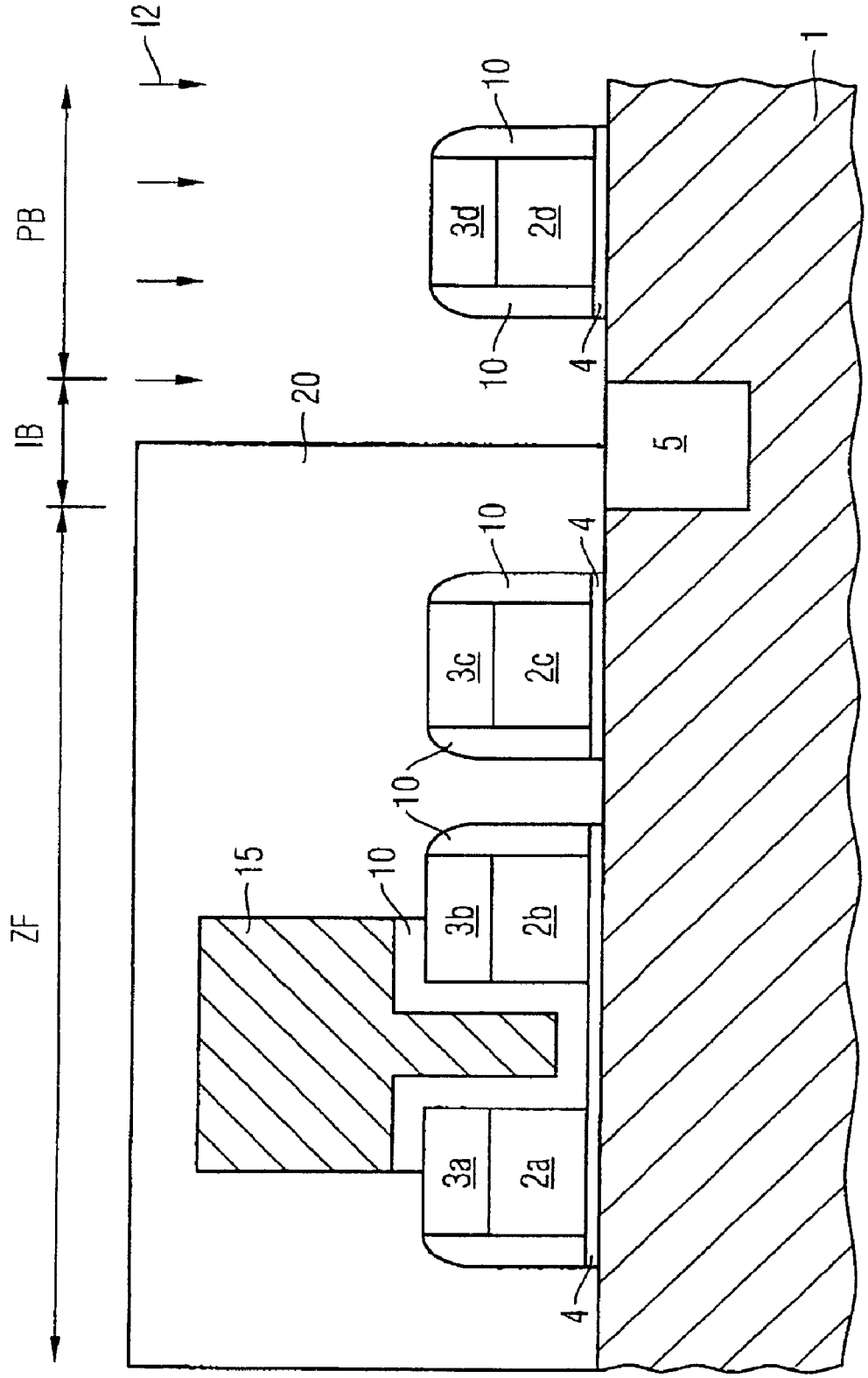

METHOD FOR PRODUCING A SEMICONDUCTOR STRUCTURE

BACKGROUND OF THE INVENTION

1. Field of the Invention

The present invention relates to a method for producing a semiconductor structure.

2. Description of the Related Art

Although applicable in principle to any integrated circuits, the present invention and the problem area on which it is based are explained with regard to memory device semiconductor structures in silicon technology.

FIGS. 2a-c show schematic illustrations of successive method stages of a method for fabricating a semiconductor structure for the purpose of elucidating the problem area on which the present invention is based.

In FIG. 2a, reference symbol 1 designates a silicon semiconductor substrate, at the surface of which a very thin gate dielectric layer 4 made of thermal silicon oxide is provided.

The silicon semiconductor substrate 1 is subdivided into a memory cell array region ZF, a peripheral element region PB and an intervening isolation region IB with an isolation trench 5, which in the present case is a "deep trench" filled with silicon oxide.

A plurality of gate stacks 2a, 3a; 2b, 3b; 2c, 3c are provided in the memory cell array region ZF, the region 2a, 2b and 2c, respectively, representing a respective gate electrode and the region 3a, 3b and 3c, respectively, representing a respective silicon nitride isolation cap.

In an analogous manner, a plurality of gate stacks 2d, 3d (although only one is shown in the drawing here) are provided in the peripheral element region PB, to be precise with a gate electrode region 2d and a silicon nitride isolation cap 3d.

A dielectric layer 10 made of silicon oxide, e.g. TEOS oxide, is deposited over the gate stacks and the top side of the semiconductor substrate 1 with the gate dielectric layer 4. A mask 15 made of polysilicon is furthermore provided in the memory cell array region ZF, which mask partially masks the gate stacks 2a, 3a and 2b, 3b.

Proceeding from the process stage shown in FIG. 2a, in accordance with FIG. 2b firstly the dielectric layer 10 is etched using the mask 15 made of polysilicon, the dielectric layer 10 being removed in the non-masked region both in the memory cell array region ZF and in the peripheral element region PB and in the isolation region IB.

What has been found to be disadvantageous about this etching is that the gate dielectric layer 4 is also removed in the non-masked region between the gate stacks and the semiconductor substrate 1 is also attacked by this etching, since the etching does not have a hundred percent selectivity between silicon oxide and silicon. As a consequence of this, dislocations may form at the edges of the gate stacks in later process steps, for example if a renewed dielectric layer made of silicon oxide (TEOS) is deposited, and adversely affect the electrical behavior (e.g. retention time) of the memory cells or of the peripheral elements.

Said etching operation is followed by a whole-area source/drain implantation I1 over the entire structure, that is to say simultaneously over the memory cell array region ZF, the isolation region IB and the peripheral element region PB.

Referring further to FIG. 2c, the memory cell array region ZF is then covered with the aid of a mask 20 made of photoresist, after which a second source/drain implantation I2 is effected for the purpose of doping the peripheral element region PB. In this case, the mask 20 made of photoresist prevents the second source/drain implantation I2 from having an influence on the memory cell array region ZF.

The exemplary method outlined above hardly permits possible improvements with regard to the etching problem outlined, since shortening the etching time for etching the dielectric layer 10 would lead to residues of the dielectric layer 10 remaining which would in turn have an adverse effect on the implantations I1 and I2, respectively.

SUMMARY OF THE INVENTION

It is an object of the present invention to provide a method for fabricating a semiconductor structure and a corresponding semiconductor structure in which the above etching problems are eliminated.

The object is achieved in accordance with the invention by means of a method for fabricating a semiconductor structure, having the steps of:

providing a semiconductor substrate, at the top side of which a gate dielectric layer is provided, a memory cell array region with a first plurality of gate stacks and a peripheral element region with a second plurality of gate stacks being provided on the gate dielectric layer;

providing a dielectric layer over the memory cell array region and the peripheral element region;

carrying out a first source/drain implantation over the memory cell array region and the peripheral element region;

forming a blocking mask over the memory cell array region;

removing the dielectric layer over the peripheral element region using the blocking mask; and carrying out a second source/drain implantation over the memory cell array region and the peripheral element region, the memory cell array region being protected by a mask.

The essential advantage of the present invention is that the dielectric layer and the underlying gate dielectric layer between the gate stacks in the memory cell array region is not removed, as a result of which an incipient etching of the underlying semiconductor substrate can be avoided.

The mask may be a photoresist mask and/or the blocking mask. The semiconductor substrate may be a silicon substrate and the gate dielectric layer may comprise silicon oxide. The dielectric layer may comprise silicon oxide.

In a restricted version of the inventive method, a polysilicon mask is provided under the blocking mask in the memory cell array region, which polysilicon mask partially masks some of the gate stacks.

An isolation region with e.g. at least one isolation trench may be provided between the memory cell array region and the peripheral element region.

DESCRIPTION OF THE DRAWINGS

FIGS. 1a-e are schematic illustrations of successive method stages of a method for fabricating a semiconductor structure in accordance with an embodiment of the present invention; and FIGS. 2a-c are schematic illustrations of successive method stages of a method for fabricating a semiconductor structure for the purpose of elucidating the problem area on which the present invention is based.

In the Figures, identical reference symbols designate identical or functionally identical constituent parts.

FIGS. 1a-e show schematic illustrations of successive method stages of a method for fabricating a semiconductor structure in accordance with an embodiment of the present invention.

Figure 1A:
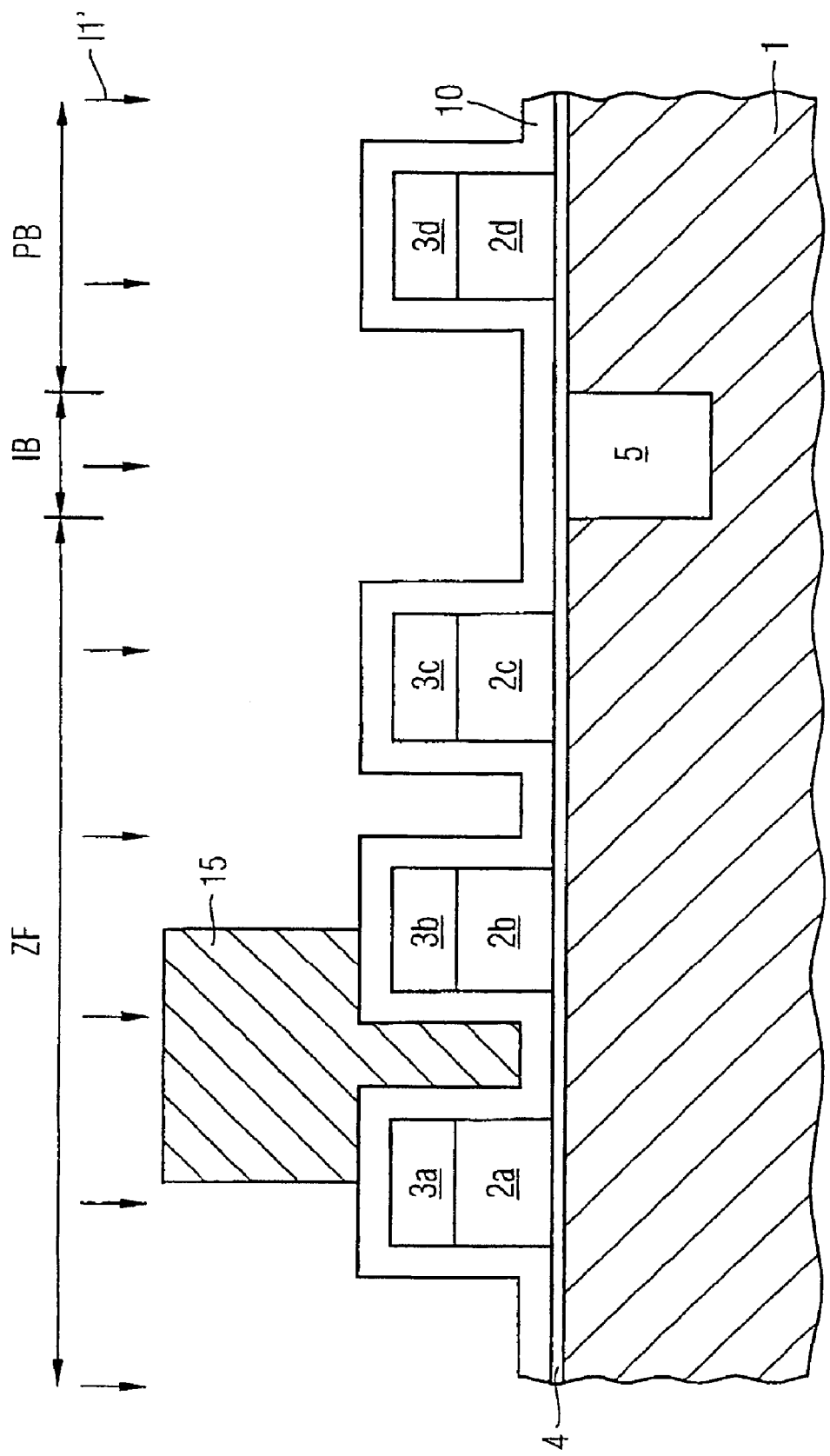

The process state shown in FIG. 1a corresponds to the process state already explained above with reference to FIG. 2a. However, after the formation of the mask 15 made of polysilicon, the first source/drain implantation I1' is carried out, whereby both the memory cell array region ZF and the peripheral element region PB are implanted.

Since this implantation I1' is now performed through the dielectric layer 10, the energy or dose of this implantation may have to be adapted. A further possibility would consist in carrying out this implantation prior to the formation of the dielectric layer, but this variant would need a higher process outlay with regard to the mask 15 made of polysilicon.

Referring further to FIG. 1b, a blocking mask 25 made of photoresist is then formed over the memory cell array region ZF.

As illustrated in FIG. 1c, the dielectric layer 10 is etched back in a next step, for example by reactive ion etching using $C_5F_8$, in order to remove the dielectric layer 10 in the insulation region IB and peripheral element region PB not masked by the blocking mask 25.

In the subsequent process step, which is illustrated in FIG. 1d, the blocking mask 25 made of photoresist is removed and afterward, in accordance with FIG. 1e, a further mask 30 made of photoresist is applied, which reaches as far as the center of the isolation region IB. The second source/drain implantation I2' is subsequently effected in order to obtain a corresponding doping of the substrate 1 in the peripheral element region PB.

The essential advantage of the present invention is that the dielectric layer 10 and the underlying gate dielectric layer between the gate stacks in the memory cell array region does not have to be removed, as a result of which an incipient etching of the underlying semiconductor substrate can be avoided. Adverse influences on the electrical behavior as in the example explained at the beginning can accordingly be avoided.

Although modifications and changes may be suggested by those skilled in the art, it is the intention of the inventors to embody within the patent warranted heron all changes and modifications as reasonably and properly come within the scope of their contribution to the art. In particular, the invention is applicable in principle to any gate structures.

We claim as our invention:

1. A method for producing a semiconductor structure, comprising the steps of:

providing a semiconductor substrate with a top surface on which a gate dielectric layer is provided; on said gate dielectric layer being provided a memory cell array region with a first plurality of gate stacks and a peripheral element region with a second plurality of gate stacks;

providing a dielectric layer over said memory cell array region and said peripheral element region;

carrying out a first source/drain implantation over said memory cell array region and said peripheral element region;

forming a blocking mask over the memory cell array region;

removing said dielectric layer over said peripheral element region using said blocking mask; and carrying out a second source/drain implantation over said memory cell array region and said peripheral element region; said memory cell array region being protected by a mask.

2. The method of claim 1, wherein said mask is a photoresist mask.

3. The method of claim 1, wherein said mask is said blocking mask.

4. The method of claim 1, wherein said semiconductor substrate is a silicon substrate and said gate dielectric layer comprises silicon oxide.

5. The method of claim 1, wherein said dielectric layer comprises silicon oxide.

6. The method of claim 1, comprising providing a polysilicon mask under said blocking mask in said memory cell array region; said polysilicon mask partially masking some of said gate stacks of said first or second pluralities of gate stacks.

7. The method of claim 1, comprising providing an isolation region between said memory cell array region and said peripheral element region.

8. The method of claim 7, wherein said isolation region comprises at least one isolation trench.

* * * * *